United States Patent
Lin et al.

(10) Patent No.: US 10,103,201 B2
(45) Date of Patent: Oct. 16, 2018

(54) FLEXIBLE DISPLAY DEVICE

(71) Applicant: E Ink Holdings Inc., Hsinchu (TW)

(72) Inventors: Kuan-Yi Lin, Hsinchu (TW); Yu-Wen Chen, Hsinchu (TW); Yu-Chieh Hung, Hsinchu (TW); Chun-Yu Lu, Hsinchu (TW); Wen-Chung Tang, Hsinchu (TW); Po-Wei Chen, Hsinchu (TW); Yu-Lin Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/641,206

(22) Filed: Jul. 3, 2017

(65) Prior Publication Data

US 2018/0012939 A1    Jan. 11, 2018

(30) Foreign Application Priority Data

Jul. 5, 2016  (CN) .......................... 2016 1 0521111
Jul. 5, 2016  (TW) ............................. 105121256 A
May 10, 2017 (TW) ............................. 106115496 A (51) Int. Cl.
| | | |
|---|---|---|
| *H01L 27/00* | (2006.01) | |
| *H01L 51/00* | (2006.01) | |
| *H01L 27/28* | (2006.01) | |
| *H01L 51/10* | (2006.01) | |
| *H01L 51/05* | (2006.01) | |
| *H01L 27/12* | (2006.01) | |

(52) U.S. Cl.
CPC ........ *H01L 27/283* (2013.01); *H01L 51/0097* (2013.01); *H01L 51/0533* (2013.01); *H01L 51/0541* (2013.01); *H01L 51/107* (2013.01); *H01L 27/124* (2013.01)

(58) Field of Classification Search
CPC . H01L 27/283; H01L 27/124; H01L 27/3244; H01L 27/1214; H01L 51/0097; H01L 51/0533; H01L 51/0541; H01L 51/107
See application file for complete search history.

(56) References Cited

U.S. PATENT DOCUMENTS

| | | |
|---|---|---|
| 7,211,738 B2 | 5/2007 | Lee et al. |
| 7,507,592 B2 | 3/2009 | Lee et al. |

(Continued)

FOREIGN PATENT DOCUMENTS

| | | |
|---|---|---|
| CN | 1971940 A | 5/2007 |
| CN | 203982331 U | 12/2014 |

(Continued)

OTHER PUBLICATIONS

Corresponding Taiwanese Office Action dated Jun. 9, 2017.

*Primary Examiner* — Nikolay Yushin
(74) *Attorney, Agent, or Firm* — CKC & Partners Co., Ltd.

(57) ABSTRACT

A flexible display device includes a flexible substrate, an inorganic barrier layer, a metal layer, an organic buffer layer, and an insulating layer. The inorganic barrier layer is located on the flexible substrate. The metal layer is located on the inorganic barrier layer and in contact with the inorganic barrier layer. The organic buffer layer covers the inorganic barrier layer and the metal layer, and has at least one conductive via connected to the metal layer. The insulating layer is located on the organic buffer layer.

19 Claims, 11 Drawing Sheets

(56) References Cited

U.S. PATENT DOCUMENTS

| | | | |
|---|---|---|---|
| 8,299,702 B2* | 10/2012 | Choi | ................... H01L 27/3276 |
| | | | 313/498 |
| 8,686,407 B2* | 4/2014 | Shu | ...................... H01L 27/326 |
| | | | 257/40 |
| 2007/0145359 A1 | 6/2007 | Che | |
| 2007/0152211 A1 | 7/2007 | Han | |
| 2009/0315458 A1* | 12/2009 | Choi | ................... H01L 27/3276 |
| | | | 313/505 |
| 2010/0026951 A1 | 2/2010 | Chiang et al. | |
| 2011/0024179 A1 | 2/2011 | Nomoto | |
| 2013/0207099 A1* | 8/2013 | Shu | .................... H01L 27/3262 |
| | | | 257/43 |
| 2013/0302998 A1 | 11/2013 | Kugler | |
| 2014/0060893 A1 | 3/2014 | Lee | |
| 2014/0225096 A1 | 8/2014 | Han et al. | |

FOREIGN PATENT DOCUMENTS

| | | |
|---|---|---|
| TW | 548757 B | 8/2003 |
| TW | 200704327 A | 1/2007 |
| TW | 200810657 A | 2/2008 |
| TW | 200951538 A | 12/2009 |
| TW | 201519445 A | 5/2015 |

* cited by examiner

FLEXIBLE DISPLAY DEVICE

RELATED APPLICATIONS

This application claims priority to Taiwan Application Serial Number 105121256, Jul. 5, 2016, and claims priority to Taiwan Application Serial Number 106115496, May 10, 2017, which claims priority to China Application Serial Number 201610521111.6, filed Jul. 5, 2016, all of which are herein incorporated by reference.

BACKGROUND

Field of Invention

The present invention relates to a flexible display device.

Description of Related Art

Generally, a flexible printed circuit board (FPC) is disposed on an edge of a display device, such that the display device may receive signals and power of an external electronic device through the flexible printed circuit board. Since a typical display device has little or no flexibility, a flexible printed circuit board electrically connected to the display device is not easily pulled or dragged. Hence, the consideration for the tensile resistance capability of the flexible printed circuit board is unneeded. However, in an organic TFT array display device, the consideration for the tensile resistance capability of the flexible printed circuit board is required due to the organic TFT array display device requiring flexibility.

In an organic TFT array display device, an organic buffer layer, an insulating layer, and an protective layer are usually stacked on an edge of a flexible substrate in sequence, and a circuit is formed between the organic buffer layer and the insulating layer to connect an integrated circuit (IC) and a flexible printed circuit board. Moreover, two ends of the circuit are respectively exposed through two through holes of the insulating layer and the protective layer, such that the integrated circuit and the flexible printed circuit board may be boned to the flexible substrate of the display device.

However, since the circuit of such electrical connection structure is in contact with the organic buffer layer that is made of an organic material, the adhesion to the circuit may be poor. As a result, after the circuit is connected to the flexible printed circuit board, the circuit is apt to be damaged due to the pulling force of the flexible printed circuit board. For example, the flexible printed circuit board may be damaged if it receives a pulling force more than 0.5 N/mm.

SUMMARY

An aspect of the present invention is to provide a flexible display device.

According to an embodiment of the present invention, a flexible display device includes a flexible substrate, an inorganic barrier layer, a first metal layer, an organic buffer layer, and an insulating layer. The inorganic barrier layer is located on the flexible substrate. The first metal layer is located on the inorganic barrier layer and in contact with the inorganic barrier layer. The organic buffer layer covers the inorganic barrier layer and the first metal layer, and has at least one conductive via connected to the first metal layer. The insulating layer is located on the organic buffer layer.

In one embodiment of the present invention, the flexible display device has a display area and a peripheral area that surrounds the display area, and includes a source/drain layer and a semiconductor layer. The source/drain layer is located in the display area and on the organic buffer layer, and has a source region and a drain region that is spaced apart from the source region. The semiconductor layer is located on the organic buffer layer that is between the source region and the drain region, and extends onto surfaces of the source region and the drain region facing away from the organic buffer layer.

In one embodiment of the present invention, the flexible display device further includes a semiconductor protective layer. The semiconductor protective layer is located on the semiconductor layer and between the insulating layer and the semiconductor layer.

In one embodiment of the present invention, the flexible display device further includes a photoresist layer. The photoresist layer is located on the semiconductor protective layer and between the insulating layer and the semiconductor protective layer.

In one embodiment of the present invention, the conductive via is connected to the source region or the drain region.

In one embodiment of the present invention, the flexible display device has a display area and a peripheral area that surrounds the display area, and further includes at least one conductive pad located in the peripheral area and on the insulating layer.

In one embodiment of the present invention, the flexible display device further includes an integrated circuit. The integrated circuit is located in the peripheral area and on the insulating layer, and is connected to the conductive pad.

In one embodiment of the present invention, the organic buffer layer and the insulating layer commonly have the conductive via that is connected to the conductive pad.

In one embodiment of the present invention, the flexible display device further includes a flexible printed circuit board. The flexible printed circuit board is located in the peripheral area and on the insulating layer, and is connected to the conductive pad.

In one embodiment of the present invention, the flexible display device has a display area and a peripheral area that surrounds the display area, and the first metal layer is located in the peripheral area and has a plurality of segments.

In one embodiment of the present invention, a thickness of the first metal layer is in a range from 1500 Å to 4000 Å.

In one embodiment of the present invention, the flexible display device has a display area and a peripheral area that surrounds the display area. The first metal layer has a first segment and a second segment, and the flexible display device further includes a protective layer, a first conductive pad, a second conductive pad, a third conductive pad, an integrated circuit, and a flexible printed circuit board. The protective layer is located on the insulating layer. The protective layer, the organic buffer layer, and the insulating layer have a first conductive via, a second conductive via, and a third conductive via in common. The first conductive pad, the second conductive pad, and the third conductive pad are located in the peripheral area and on the protective layer. Two ends of the first conductive via are respectively connected to the first conductive pad and the first segment. Two ends of the second conductive via are respectively connected to the second conductive pad and the second segment. Two ends of the third conductive via are respectively connected to the third conductive pad and the second segment. The integrated circuit is connected to the first segment and the second segment through the first conductive pad, the second conductive pad, the first conductive via, and the second conductive via. The flexible printed circuit board is connected to the second segment through the third conductive pad and the third conductive via.

In one embodiment of the present invention, the first metal layer extends to an edge of the flexible substrate, and is located between the organic buffer layer and the flexible substrate.

In one embodiment of the present invention, the flexible display device further includes a protective layer. The protective layer is located on the insulating layer. The protective layer, the insulating layer, and the organic buffer layer together have two through holes, and the first metal layer is partially located in the through holes.

In one embodiment of the present invention, the flexible display device further includes a second metal layer. The second metal layer is located on the first metal layer that is located in the through holes, and extends to sidewalls of the organic buffer layer surrounding the through holes, and extends between the organic buffer layer and the insulating layer.

In one embodiment of the present invention, the second metal layer extends from the first metal layer that is located in one of the through holes to the first metal layer that is located in the other through hole.

In one embodiment of the present invention, the flexible display device further includes a first conductive layer. The first conductive layer is located on the second metal layer that is located in the through holes, such that the second metal layer is located between the first conductive layer and the first metal layer.

In one embodiment of the present invention, the first conductive layer extends to sidewalls of the insulating layer surrounding the through holes, and extends between the insulating layer and the protective layer.

In one embodiment of the present invention, the first conductive layer extends from the second metal layer that is located in one of the through holes to the second metal layer that is located in the other through hole.

In one embodiment of the present invention, the flexible display device further includes a second conductive layer. The second conductive layer is located on the first conductive layer that is located in the through holes, such that the first conductive layer is located between the second conductive layer and the second metal layer.

In one embodiment of the present invention, the second conductive layer extends to sidewalls of the protective layer surrounding the through holes, and extends to a surface of the protective layer facing away from the insulating layer.

In one embodiment of the present invention, the insulating layer is located between the protective layer and the organic buffer layer.

In one embodiment of the present invention, the flexible display device further includes an integrated circuit. The integrated circuit is electrically connected to the first metal layer that is located in one of the through holes.

In one embodiment of the present invention, the flexible display device further includes a flexible printed circuit board. The flexible printed circuit board is electrically connected to the first metal layer that is located in the other through hole.

In one embodiment of the present invention, the first metal layer is made of a material comprising aluminum, molybdenum, chromium, titanium, copper, nickel, or alloys thereof.

In the aforementioned embodiment of the present invention, since the first metal layer is not an organic material and is directly located on the inorganic barrier layer, a good adhesion is formed between the first metal layer and the inorganic barrier layer. When the flexible display device receives a force to be bent, the breakage of the first metal layer caused by warpage does not easily occur. Furthermore, the first metal layer is under the organic buffer layer, and hence the organic buffer layer is prevented from sliding on the inorganic barrier layer to form displacement, such that conductive lines above the organic buffer layer are not broken due to warpage. The organic buffer layer has the conductive via that is electrically connected to the first metal layer, and thus the conductive lines above the organic buffer layer may be electrically connected to the first metal layer through the conductive via. In addition, because the first metal layer is located on the inorganic barrier layer, metal materials except gold and silver may be selectively used in a wet etching process to have good critical dimension (CD) loss without needing to consider the matching problem of thermal extension. As a result, the line width and spacing of the first metal layer in a non-display area may be reduced, and hence the width of the non-display area can be reduced. Alternatively, the first metal layer does not occupy much space in the non-display area to facilitate packaging modules.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
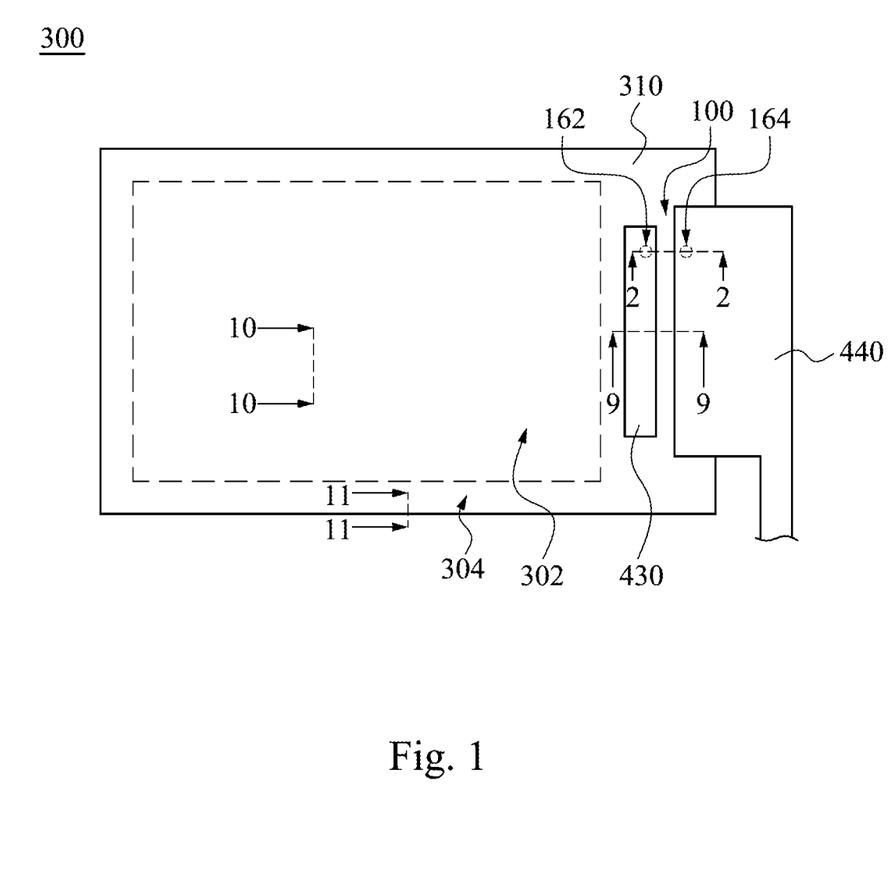
FIG. 1 is a top view of a flexible display device according to one embodiment of the present invention.
Figure 2:
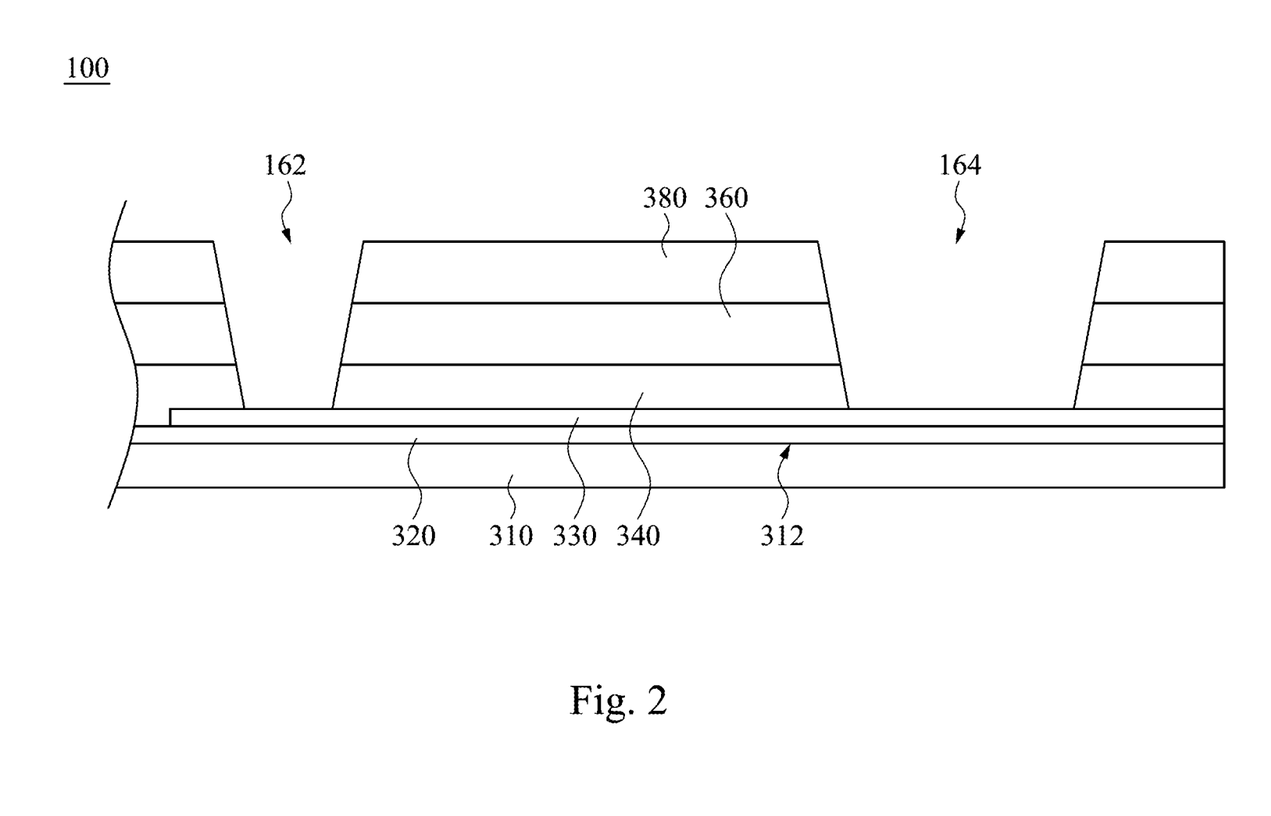
FIG. 2 is a cross-sectional view of an electrical connection structure of the flexible display device taken along line 2-2 shown in FIG. 1.

FIG. 1 is a top view of a flexible display device 300 according to one embodiment of the present invention. FIG. 2 is a cross-sectional view of an electrical connection structure 100 of the flexible display device 300 taken along line 2-2 shown in FIG. 1. In order to simplify the drawings, an integrated circuit 430 and a flexible printed circuit board 440 shown in FIG. 1 are omitted in FIGS. 2 to 5 and FIGS. 7 to 8. As shown in FIG. 1 and FIG. 2, the flexible display device 300 has a display area 302 and a peripheral area 304 that surrounds the display area 302. As shown in FIG. 1, the inner area of the dashed line is the display area 302, and the outer area of the dashed line is the peripheral area 304. The display area 302 may be referred to as a pixel area or an active area, and may have a transistor array therein. The peripheral area 304 may be referred to as a non-pixel area, a non-display area, or a shielding area, and may have conductive lines thereon. The electrical connection structure 100 is disposed on the edge of the flexible display device 300. For example, the electrical connection structure 100 is located outside of the display area 302. The electrical connection structure 100 includes a flexible substrate 310, a first metal layer 330, an organic buffer layer 340, an insulating layer 360, and a protective layer 380.

The first metal layer 330 is located on the surface 312 of the flexible substrate 310, and extends to the edge of the flexible substrate 310. The organic buffer layer 340 is located on the flexible substrate 310 and the first metal layer 330, such that the first metal layer 330 is located between the organic buffer layer 340 and the flexible substrate 310. The insulating layer 360 is located on the organic buffer layer 340. The protective layer 380 is located on the insulating layer 360. In other words, the insulating layer 360 is located between the protective layer 380 and the organic buffer layer 340.

Moreover, the protective layer 380, the insulating layer 360, and the organic buffer layer 340 together have two through holes 162, 164, such that the first metal layer 330 is partially located below and contacts the through holes 162, 164. In this embodiment, the first metal layer 330 is exposed through the through holes 162, 164, and the first metal layer 330 in the through hole 162 may be utilized to electrical connect the integrated circuit 430, and the first metal layer 330 in the through hole 164 may be utilized to electrically connect the flexible printed circuit board 440.

Since the first metal layer 330 of the electrical connection structure 100 is located on the flexible substrate 310, is not located on an organic material, the adhesion to the first metal layer 330 may be improved. Furthermore, the organic buffer layer 340, the insulating layer 360, and the protective layer 380 are stacked on the first metal layer 330 in sequence, and the first metal layer 330 is located below and contacts the through holes 162, 164. As a result of such a design, when the conductive pads of the integrated circuit 430 and the flexible printed circuit board 440 are respectively disposed in the two through holes 162, 164, the flexible printed circuit board 440 may be electrically connected to the integrated circuit 430 through the first metal layer 330, such that signals may be transmitted between the flexible printed circuit board 440 and the integrated circuit 430.

In addition, since the adhesion between the first metal layer 330 and the flexible substrate 310 is good, the tensile resistance capability of the flexible printed circuit board 440 may be improved. When the flexible display device 300 is bent to pull and drag the flexible printed circuit board 440, the electrical connection structure 100 may prevent the first metal layer 330 and other metal layers (to be described hereinafter) below the through holes 162, 164 from being damaged by the pulling force of the flexible printed circuit board 440. For example, the first metal layer 330 may be prevented from separating from the flexible substrate 310.

In this embodiment, the flexible substrate 310 may be made of material including silicon or polyimide (PI), but the present invention is not limited in this regard. The first metal layer 330 is made of a material including aluminum, molybdenum, chromium, titanium, copper, nickel, or alloys thereof (e.g., MoCr), thereby forming a good adhesion between the first metal layer 330 and the flexible substrate 310. Moreover, the thickness of the first metal layer 330 may be in a range from 1500 Å to 4000 Å, such that the first metal layer 330 has good strength. Hence, when the first metal layer 330 is bent or receives the pulling force of the flexible printed circuit board 440, the first metal layer 330 is not easily broken.

Furthermore, the flexible substrate 310 has an inorganic barrier layer 320 (e.g., silicon nitride; SiNx) that covers the surface 312, and at least a portion of the inorganic barrier layer 320 (e.g., the inorganic barrier layer 320 on the edge of the flexible substrate 310) is covered by the first metal layer 330. The inorganic barrier layer 320 may be used to prevent water and gas from entering the flexible substrate 310, thereby extending the lifetime of the flexible display device 300.

It is to be noted that the connection relationships and materials of the elements described above will not be repeated in the following description, and only aspects related to other types of electrical connection structure will be described.

Figure 3:
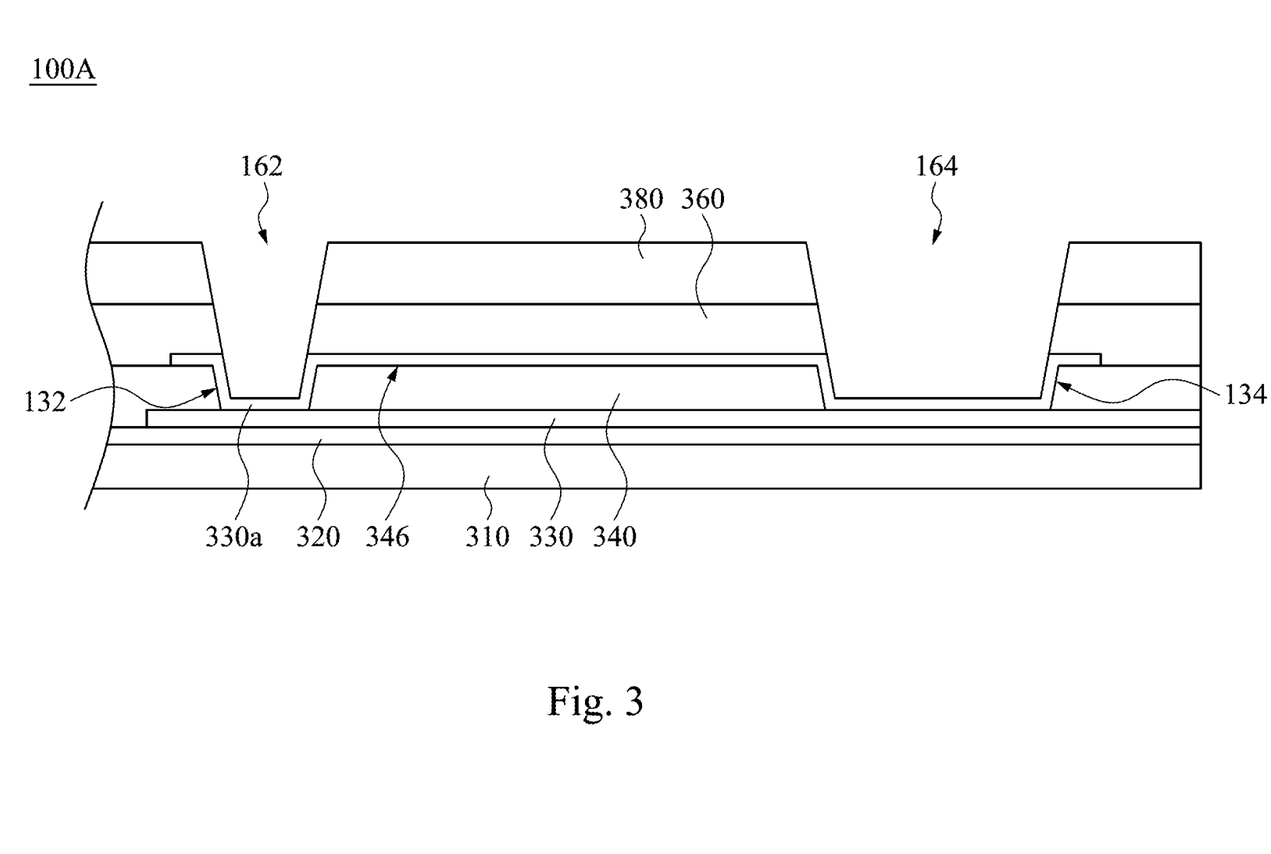
FIG. 3 is a cross-sectional view of an electrical connection structure of a flexible display device according to one embodiment of the present invention.

FIG. 3 is a cross-sectional view of an electrical connection structure 100A of a flexible display device according to one embodiment of the present invention. As shown in FIG. 1 and FIG. 3, the electrical connection structure 100A includes the flexible substrate 310, the first metal layer 330, the organic buffer layer 340, the insulating layer 360, and the protective layer 380. The difference between this embodiment and the embodiment shown in FIG. 2 is that the electrical connection structure 100A further includes a second metal layer 330a. The second metal layer 330a is located on the first metal layer 330 that is located under the through holes 162, 164 and extends to the sidewall 132 of the organic buffer layer 340 surrounding the through hole 162 and the sidewall 134 of the organic buffer layer 340 surrounding the through hole 164. Moreover, second metal layer 330a extends between the organic buffer layer 340 and the insulating layer 360. In this embodiment, the second metal layer 330a extends from the first metal layer 330 that is located under the through hole 162 to the first metal layer 330 that is located under the other through hole 164, such that the second metal layer 330a covers the surface 346 of the organic buffer layer 340 between the through holes 162, 164.

When the conductive pads of the integrated circuit 430 and the flexible printed circuit board 440 are respectively disposed in the through holes 162, 164, the flexible printed circuit board 440 may be electrically connected to the integrated circuit 430 through the first and second metal layers 330, 330a, such that signals may be transmitted between the flexible printed circuit board 440 and the integrated circuit 430. As a result of such a design, when any one of the first and second metal layers 330, 330a is broken, the integrated circuit 430 may still electrically conduct with the flexible printed circuit board 440. In other words, each of the first and second metal layers 330, 330a may be used as the circuit of the electrical connection structure 100A for electrically connecting the integrated circuit 430 and the flexible printed circuit board 440.

In this embodiment, since the second metal layer 330a is not the first layer on the flexible substrate 310, the thickness of the second metal layer 330a may be smaller than that of the first metal layer 330 to save the material cost of the electrical connection structure 100A, but the present invention is not limited in this regard.

Figure 4:
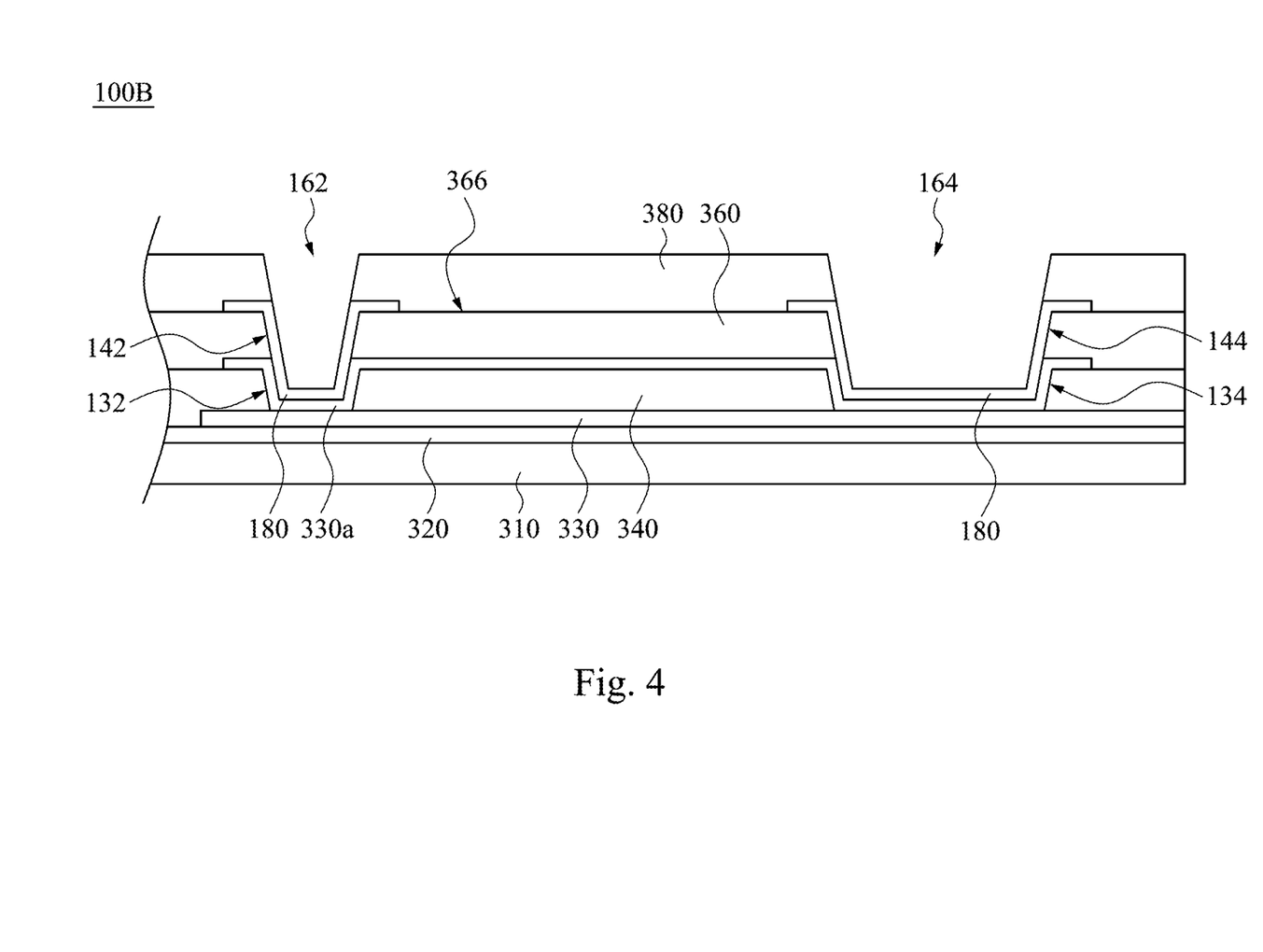
FIG. 4 is a cross-sectional view of an electrical connection structure of a flexible display device according to one embodiment of the present invention.

FIG. 4 is a cross-sectional view of an electrical connection structure 100B of a flexible display device according to one embodiment of the present invention. As shown in FIG. 1 and FIG. 4, the electrical connection structure 100B includes the flexible substrate 310, the first metal layer 330, the organic buffer layer 340, the insulating layer 360, the protective layer 380, and the second metal layer 330a. The difference between this embodiment and the embodiment shown in FIG. 3 is that the electrical connection structure 100B further includes a first conductive layer 180. The first conductive layer 180 is located on the second metal layer 330a that is located in the through holes 162, 164, such that the second metal layer 330a is located between the first conductive layer 180 and the first metal layer 330. In addition, the first conductive layer 180 extends to the sidewall 142 of the insulating layer 360 surrounding the through hole 162, and extends to the sidewall 144 of the insulating layer 360 surrounding the through hole 164. In this embodiment, the first conductive layer 180 further extends between the insulating layer 360 and the protective layer 380. In other words, the first conductive layer 180 extends to the surface 366 of the insulating layer 360.

When the conductive pads of the integrated circuit 430 and the flexible printed circuit board 440 are respectively disposed in the through holes 162, 164, the first conductive layer 180 may be used as bonding pads, such that the integrated circuit 430 and the flexible printed circuit board 440 may be electrically connected to the first and second metal layers 330, 330a through the first conductive layer 180 that is located in the through holes 162, 164.

Figure 5:
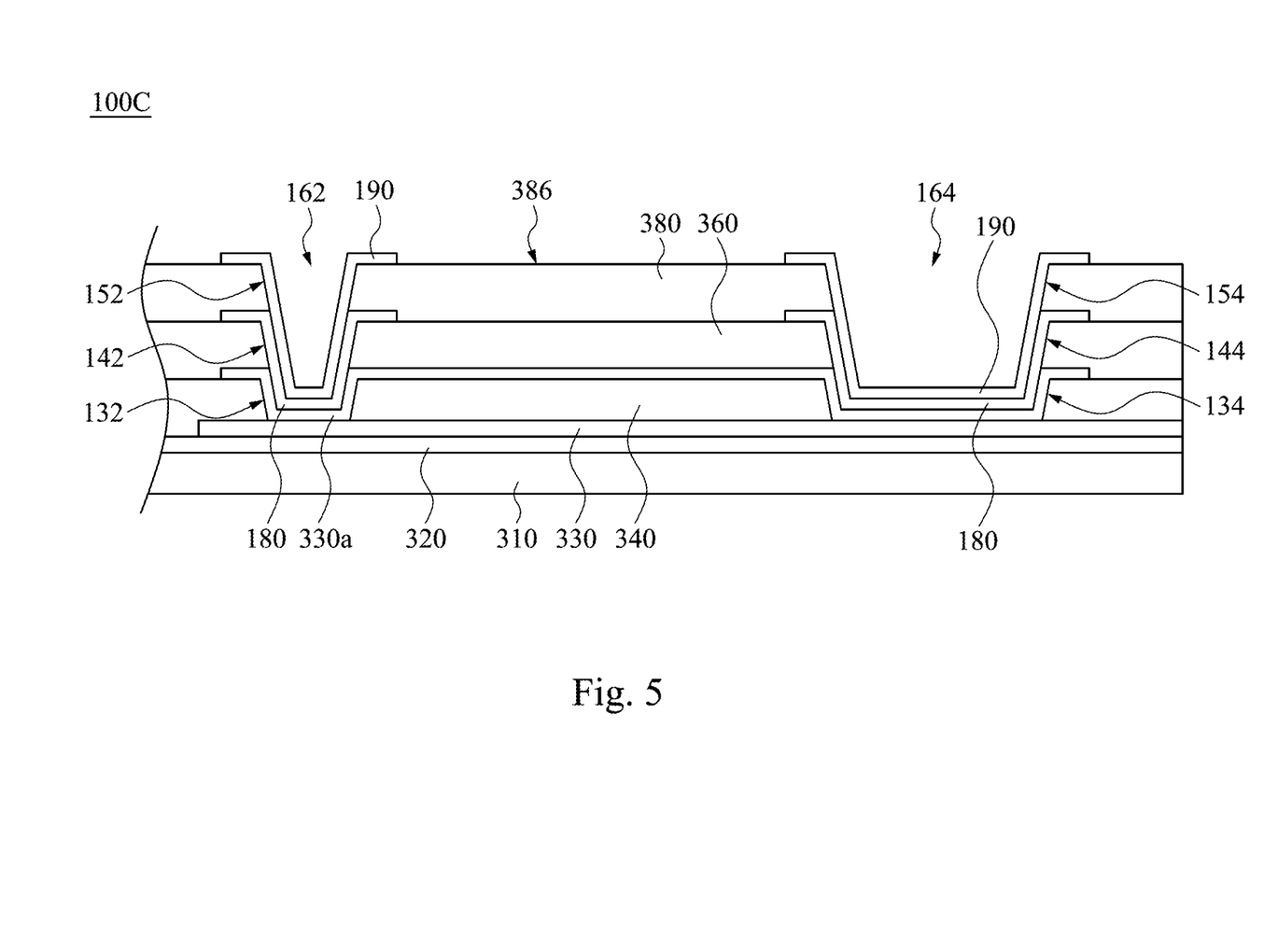
FIG. 5 is a cross-sectional view of an electrical connection structure of a flexible display device according to one embodiment of the present invention.

FIG. 5 is a cross-sectional view of an electrical connection structure 100C of a flexible display device according to one embodiment of the present invention. As shown in FIG. 1 and FIG. 5, the electrical connection structure 100C includes the flexible substrate 310, the first metal layer 330, the organic buffer layer 340, the insulating layer 360, the protective layer 380, the second metal layer 330a, and the first conductive layer 180. The difference between this embodiment and the embodiment shown in FIG. 4 is that the electrical connection structure 100C further includes a second conductive layer 190. The second conductive layer 190 is located on the first conductive layer 180 that is located in the through holes 162, 164, such that the first conductive layer 180 is located between the second conductive layer 190 and the second metal layer 330a. Moreover, the second conductive layer 190 extends to the sidewall 152 of the protective layer 380 surrounding the through hole 162, and extends to the sidewall 154 of the protective layer 380 surrounding the through hole 164. In this embodiment, the second conductive layer 190 further extends to the surface 386 of the protective layer 380 facing away from the insulating layer 360.

When the conductive pads of the integrated circuit 430 and the flexible printed circuit board 440 are respectively disposed in the through holes 162, 164, the second conductive layer 190 may be used as bonding pads, such that the integrated circuit 430 and the flexible printed circuit board 440 may be electrically connected to the first and second metal layers 330, 330a through the first and second conductive layers 180, 190 that are located in the through holes 162, 164.

Figure 6:
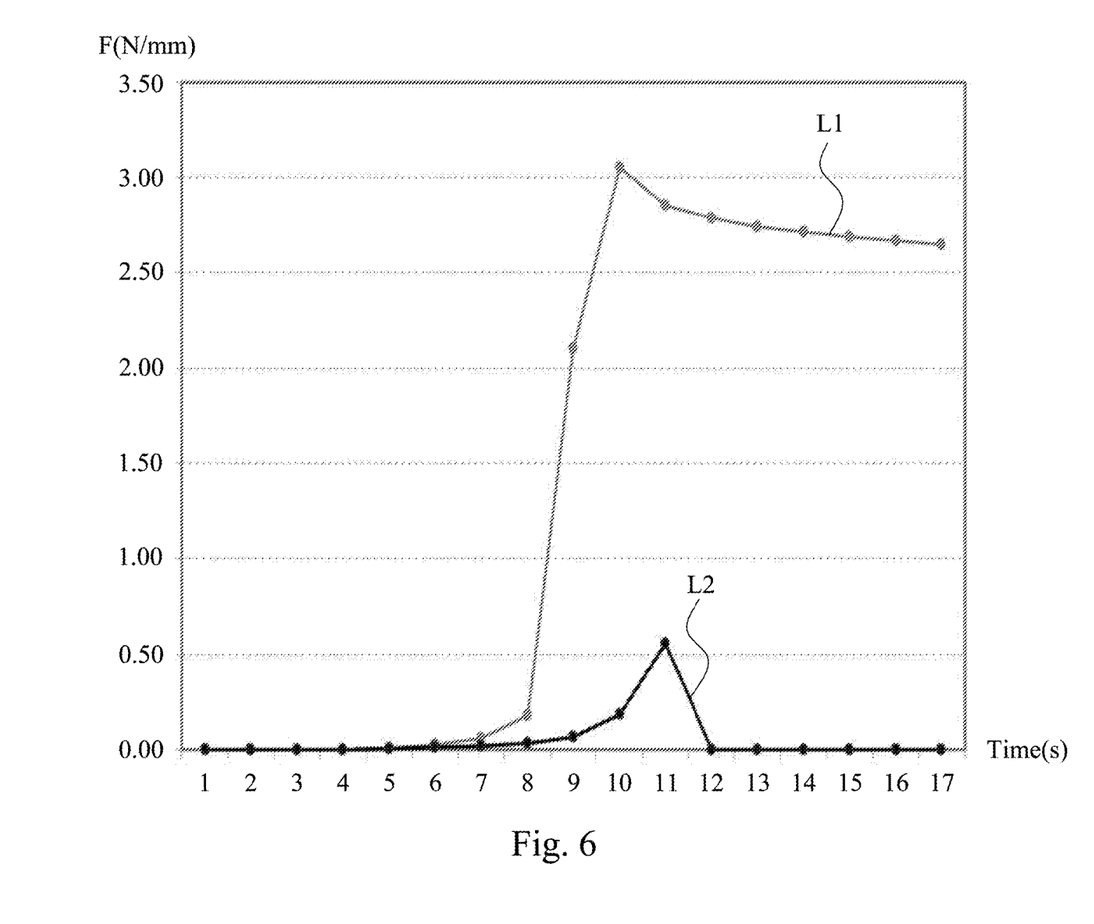
FIG. 6 is a pulling force-time relationship chart of a flexible printed circuit board that is connected to the electrical connection structure shown in FIG. 5 and a flexible printed circuit board that is connected to a typical electrical connection structure.

FIG. 6 is a pulling force-time relationship chart of a flexible printed circuit board that is connected to the electrical connection structure 100C shown in FIG. 5 and a flexible printed circuit board that is connected to a typical electrical connection structure. As shown in FIG. 5 and FIG. 6, when the conductive pad of a flexible printed circuit board is disposed on the second conductive layer 190 that is located on the through hole 164 show in FIG. 5, the flexible printed circuit board in the electrical connection structure 100C can receive a pulling force of about 3 N/mm (e.g., 3.05 N/mm, which is the maximum of broken line L1) that is obviously greater than a pulling force that can be received by a flexible printed circuit board in a typical electrical connection structure (e.g., 0.56 N/mm, which is the maximum of broken line L2), but the present invention is not limited to the aforesaid data.

Figure 7:
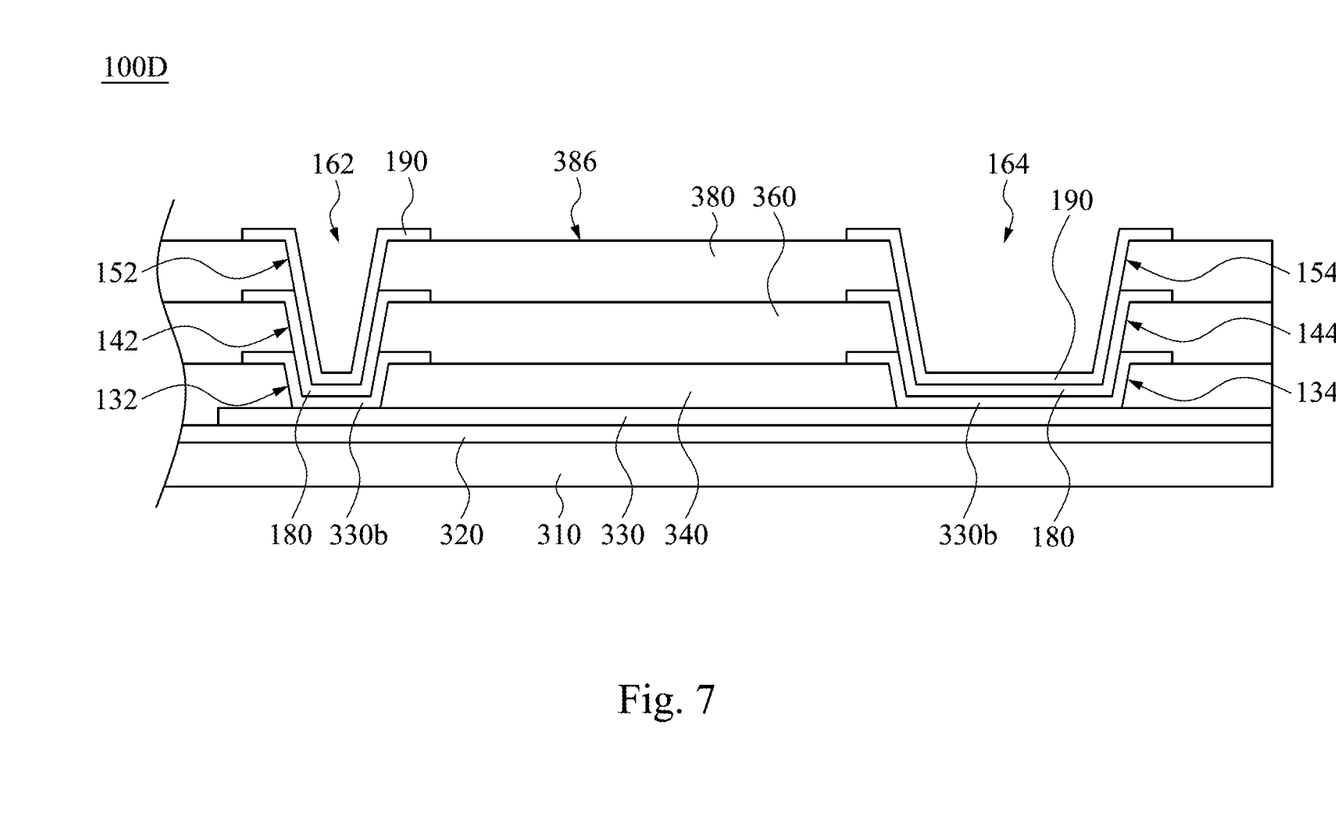
FIG. 7 is a cross-sectional view of an electrical connection structure of a flexible display device according to one embodiment of the present invention.

FIG. 7 is a cross-sectional view of an electrical connection structure 100D of a flexible display device according to one embodiment of the present invention. The electrical connection structure 100D includes the flexible substrate 310, the first metal layer 330, the organic buffer layer 340, the insulating layer 360, the protective layer 380, a second metal layer 330b, the first conductive layer 180, and the second conductive layer 190. The difference between this embodiment and the embodiment shown in FIG. 5 is that the second metal layer 330b does not extend from the first metal layer 330 that is located in the through hole 162 to the first metal layer 330 that is located in the through hole 164. The second metal layer 330b includes two portions, such that at least a portion of the insulating layer 360 may be located between the two portions of the second metal layer 330b.

Figure 8:
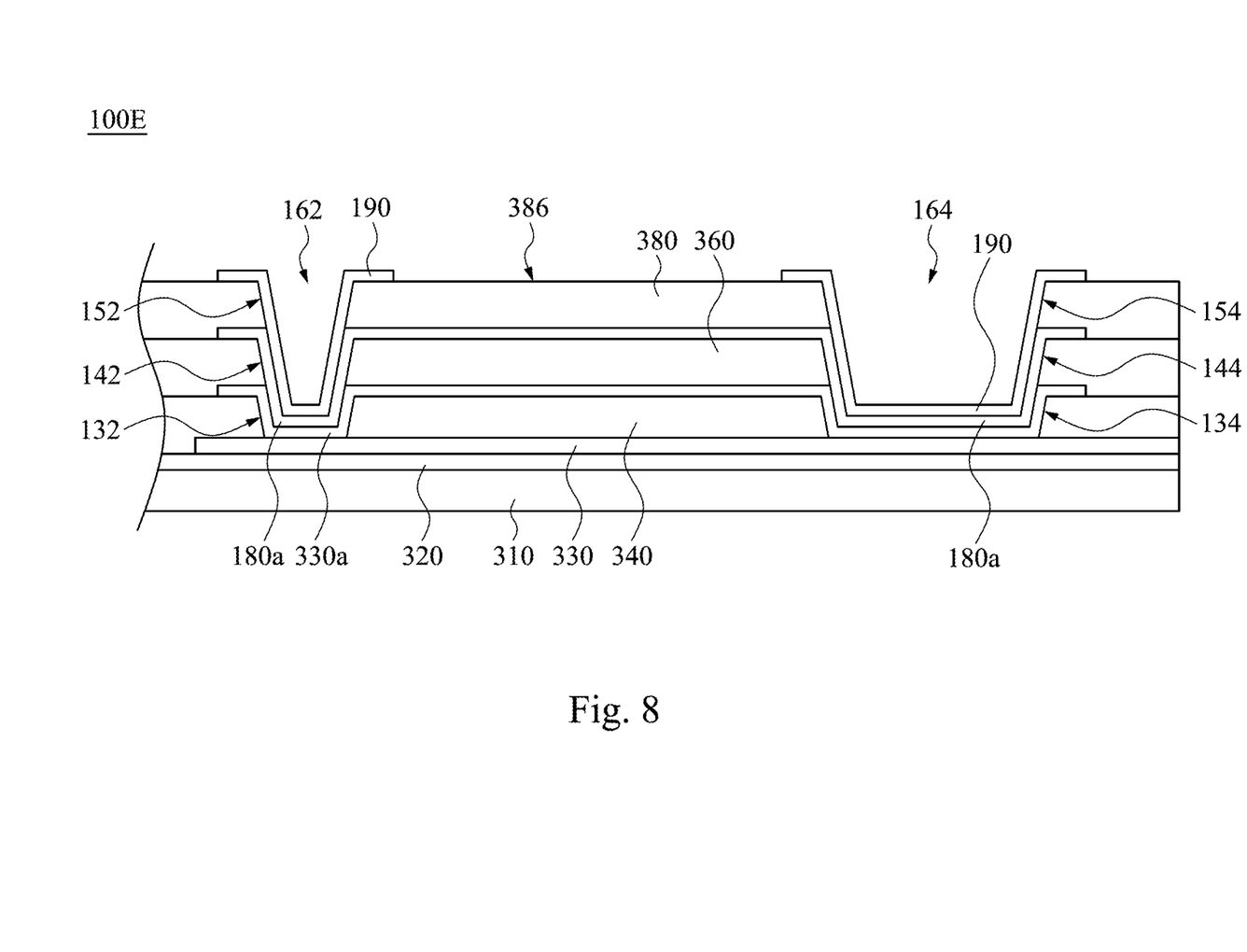
FIG. 8 is a cross-sectional view of an electrical connection structure of a flexible display device according to one embodiment of the present invention.

FIG. 8 is a cross-sectional view of an electrical connection structure 100E of a flexible display device according to one embodiment of the present invention. The electrical connection structure 100E includes the flexible substrate 310, the first metal layer 330, the organic buffer layer 340, the insulating layer 360, the protective layer 380, the second metal layer 330a, a first conductive layer 180a, and the second conductive layer 190. The difference between this embodiment and the embodiment shown in FIG. 5 is that the first conductive layer 180a extends from the second metal layer 330a that is located in the through hole 162 to the second metal layer 330a that is located in the other through hole 164.

As shown in FIG. 1 and FIG. 8, when the conductive pads of the integrated circuit 430 and the flexible printed circuit board 440 are respectively disposed in the two through holes 162, 164, the flexible printed circuit board 440 may be electrically connected to the integrated circuit 430 through the first metal layer 330, the second metal layer 330a, and the first conductive layer 180a, such that signals may be transmitted between the flexible printed circuit board 440 and the integrated circuit 430. As a result of such a design, when any one of the first metal layer 330, the second metal layer 330a, and the first conductive layer 180a is broken or any two of the first metal layer 330, the second metal layer 330a, and the first conductive layer 180a are broken, the integrated circuit 430 may still be electrically connected to the flexible printed circuit board 440.

Figure 9:
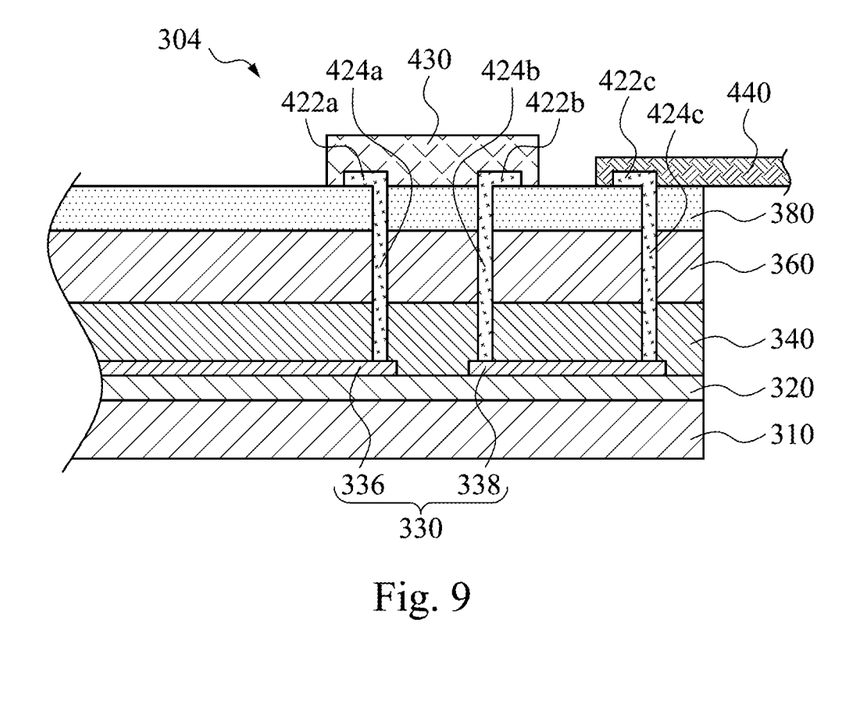
FIG. 9 is a cross-sectional view of the flexible display device taken along line 9-9 shown in FIG. 1.

FIG. 9 is a cross-sectional view of the flexible display device 300 taken along line 9-9 shown in FIG. 1. As shown in FIG. 1 and FIG. 9, the cross-sectional position of FIG. 9 is the peripheral area 304 capable of electrically connecting the integrated circuit 430 and the flexible printed circuit board 440. The flexible display device 300 further includes a first conductive pad 422a, a second conductive pad 422b, and a third conductive pad 422c that are located in the peripheral area 304 and on the protective layer 380. The flexible display device 300 further includes the integrated circuit 430 and the flexible printed circuit board 440. The integrated circuit 430 is located in the peripheral area 304 and on the insulating layer 380, and is electrically connected to the first conductive pad 422a and the second conductive pad 422b. The flexible printed circuit board 440 is located in the peripheral area 304 and on the insulating layer 380, and is electrically connected to the third conductive pad 422c.

In this embodiment, the metal layer 330 has segments 336, 338. The organic buffer layer 340, the insulating layer 360, and the protective layer 380 have a first conductive via 424a, a second conductive via 424b, and a third conductive via 424c in common. Two ends of the first conductive via 424a are respectively electrically connected to the first conductive pad 422a and the segment 336 of the metal layer 330. Two ends of the second conductive via 424b are respectively electrically connected to the second conductive pad 422b and the segment 338 of the metal layer 330. As a result of such a configuration, the integrated circuit 430 may be electrically connected to the segments 336 and 338 of the metal layer 330 through the first conductive pad 422a, the second conductive pad 422b, the first conductive via 424a, and the second conductive via 424b. Moreover, two ends of the third conductive via 424c are respectively electrically connected to the third conductive pad 422c and the segment 338 of the metal layer 330, and thus the flexible printed circuit board 440 may be electrically connected to the segment 338 of the metal layer 330 through the third conductive pad 422c and the third conductive via 424c.

Since the metal layer 330 is located on the inorganic barrier layer 320, without needing to consider the matching problem of thermal extension, the thickness of the metal layer 330 may be increased to reduce impedance. Furthermore, when the flexible display device 300 is bent, the metal layer 330 with a large thickness can prevent being damaged due to the bending. As a result, the metal layer 330 can be securely disposed on the inorganic barrier layer 320, and may have a large thickness to electrically connect the integrated circuit 430 and the flexible printed circuit board 440, thereby effectively improving the yield of the flexible display device 300.

Figure 10:
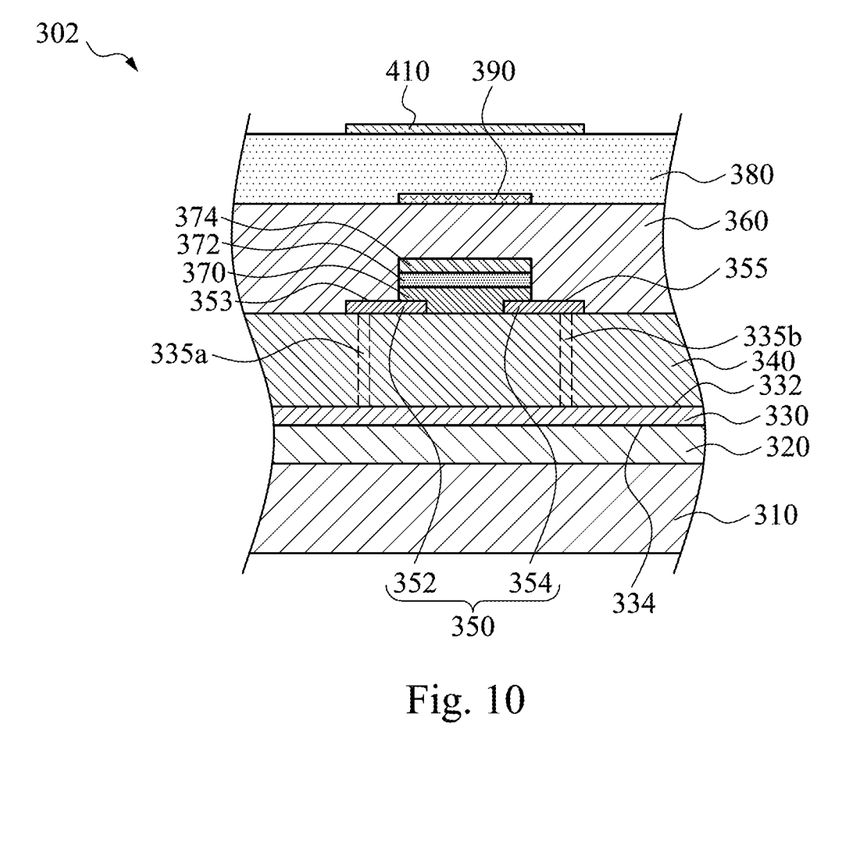
FIG. 10 is a cross-sectional view of the flexible display device taken along line 10-10 shown in FIG. 1.

FIG. 10 is a cross-sectional view of the flexible display device 300 taken along line 10-10 shown in FIG. 1. As shown in FIG. 1 and FIG. 10, the flexible display device 300 includes the flexible substrate 310, the inorganic barrier layer 320, the first metal layer 330, the organic buffer layer 340, the insulating layer 360, and the protective layer 380. The inorganic barrier layer 320 is located on the flexible substrate 310. The first metal layer 330 is located on the inorganic barrier layer 320. The organic buffer layer 340 is located on the first metal layer 330. Two opposite surfaces 332 and 334 of the first metal layer 330 are respectively in contact with the organic buffer layer 340 and the inorganic barrier layer 320. The organic buffer layer 340 has a conductive via 335a that is electrically connected to the first metal layer 330. The insulating layer 360 is located on the organic buffer layer 340. The protective layer 380 is located on the insulating layer 360.

In this embodiment, the inorganic barrier layer 320 may be made of a material including silicon nitride (SiNx) or silicon oxide (SiOx), but the present invention is not limited in this regard.

Since the first metal layer 330 is not an organic material and is directly located on the inorganic barrier layer 320, a good adhesion is formed between the first metal layer 330 and the inorganic barrier layer 320. When the flexible display device 300 receives a force to be bent, the breakage of the first metal layer 330 caused by warpage does not easily occur. Furthermore, the first metal layer 330 is under the organic buffer layer 340, and hence the organic buffer layer 340 is prevented from sliding on the inorganic barrier layer 320 to form displacement, such that conductive lines above the organic buffer layer 340 are not broken due to warpage. Moreover, the organic buffer layer 340 has the conductive via 335a that is electrically connected to the first metal layer 330, and thus the conductive lines above the organic buffer layer 340 may be electrically connected to the first metal layer 330 through the conductive via 335a.

The flexible display device 300 further includes a source/drain layer 350 and a semiconductor layer 370. The source/drain layer 350 is located in the display area 302 and on the organic buffer layer 340, and has a source region 352 and a drain region 354 that is spaced apart from the source region 352. The semiconductor layer 370 is located on the organic buffer layer 340 that is between the source region 352 and the drain region 354. Furthermore, the semiconductor layer 370 extends onto a surface 353 of the source region 354 facing away from the organic buffer layer 340, and extends onto a surface 355 of the drain region 354 facing away from the organic buffer layer 340.

In this embodiment, the conductive via 335a is electrically connected to the source region 352 and the first metal layer 330, and hence an electric current may be transmitted to the source region 352 through the first metal layer 330. In another embodiment, the flexible display device 300 may have a conductive via 335b without conductive via 335a, the conductive via 335b is electrically connected to the drain region 354 and the first metal layer 330, and hence an electric current may be transmitted to the first metal layer 330 through the drain region 354.

In addition, the flexible display device 300 further includes a semiconductor protective layer 372 and a photoresist layer 374. The semiconductor protective layer 372 is located on the semiconductor layer 370 and is located between the insulating layer 360 and the semiconductor layer 370. The photoresist layer 374 is located on the semiconductor protective layer 372 and is located between the insulating layer 360 and the semiconductor protective layer 372.

The flexible display device 300 further includes a gate electrode 390 and a pixel electrode 410. The gate electrode 390 is located on the insulating layer 360, and a portion of the insulating layer 360 is located between the gate electrode 390 and the semiconductor layer 370. The gate electrode 390 is covered by the protective layer 380. The pixel electrode 410 is located on the protective layer 380, and a portion of the protective layer 380 is located between the pixel electrode 410 and the gate electrode 390.

In this embodiment, the semiconductor protective layer 372 may be made of an organic material to be an organic protective layer (OPL). The photoresist layer 374 may be made of an organic material to be an organic photoresist (OPR) layer. The insulating layer 360 may be made of an organic material to be an organic gate insulator (OGI). The protective layer 380 may be made of an organic material to be an organic passivation (OPV) layer.

It is to be noted that the connection relationships and materials of the elements described above will not be repeated in the following description, and aspects related to the structure of the flexible display device 300 in the peripheral area 304 will be described.

Figure 11:
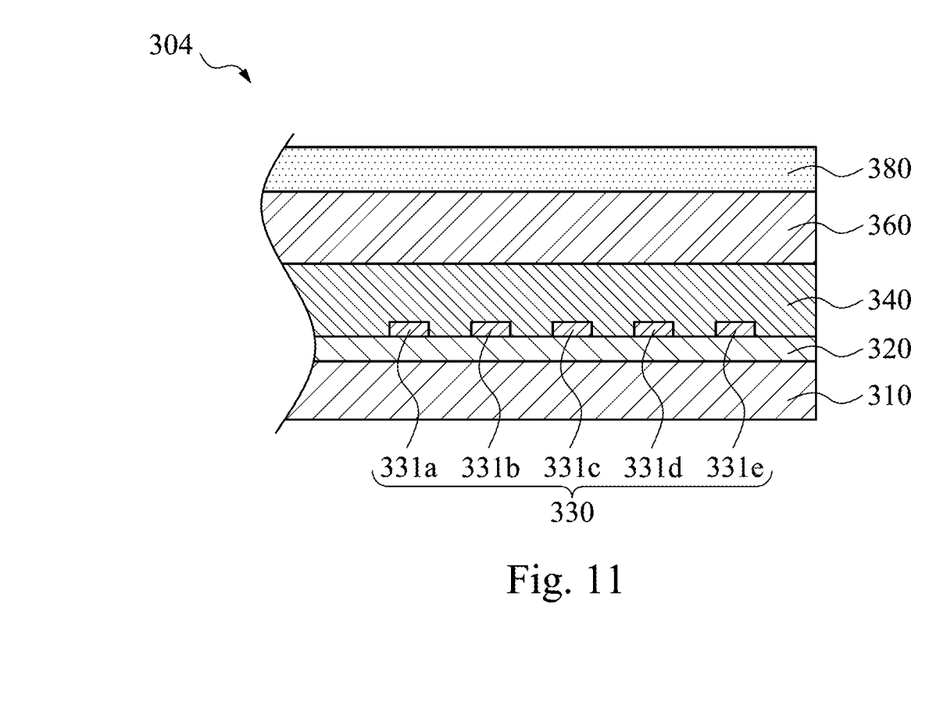
FIG. 11 is a cross-sectional view of the flexible display device taken along line 11-11 shown in FIG. 1.

FIG. 11 is a cross-sectional view of the flexible display device 300 taken along line 11-11 shown in FIG. 1. As shown in FIG. 1 and FIG. 11, FIG. 11 is a cross-sectional view of the peripheral area 304, and the first metal layer 330 is located in the peripheral area 304 and has plural segments 331a, 331b, 331c, 331d, and 331e. The first metal layer 330 in the peripheral area 304 may be referred to as peripheral conductive lines outside the display area 302. The organic buffer layer 340 covers the inorganic barrier layer 320 and the segments 331a, 331b, 331c, 331d, and 331e of the first metal layer 330. The present invention is not limited to the number of the segments of the first metal layer 330, and the number of the segments can be decided by designers as they deem necessary. In addition, in this embodiment, the method of patterning the first metal layer 330 may include a wet etching process.

Since the first metal layer 330 is located on the inorganic barrier layer 320, metal materials except gold and silver, such as aluminum or a molybdenum-chromium (MoCr) alloy, may be selectively used in a wet etching process to have good critical dimension (CD) loss without needing to consider the matching problem of thermal extension. As a result, the thickness of each of the segments 331a, 331b, 331c, 331d, and 331e of the first metal layer 330 (i.e., line width) and spacing between two adjacent segments of the first metal layer 330 (i.e., line spacing) in the peripheral area 304 (i.e., non-display area) may be reduced, and hence the width of the peripheral area 304 can be reduced, thereby facilitating narrow design of frame width. Alternatively, the space of the peripheral area 304 occupied by the first metal layer 330 can be reduced to facilitate packaging modules.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A flexible display device, having a display area and a peripheral area that surrounds the display area, the flexible display device comprising:
    a flexible substrate;
    an inorganic barrier layer located on the flexible substrate;
    a first metal layer located on the inorganic barrier layer and in contact with the inorganic barrier layer;
    an organic buffer layer covering the inorganic barrier layer and the first metal layer, and having at least one conductive via connected to the first metal layer;
    a source/drain layer located in the display area and on the organic buffer layer, and having a source region and a drain region that is spaced apart from the source region;
    a semiconductor layer located on the organic buffer layer that is between the source region and the drain region, and extending onto surfaces of the source region and the drain region facing away from the organic buffer layer; and
    an insulating layer located on the organic buffer layer.

2. The flexible display device of claim 1, further comprising:
    a semiconductor protective layer located on the semiconductor layer and between the insulating layer and the semiconductor layer.

3. The flexible display device of claim 2, further comprising:
    a photoresist layer located on the semiconductor protective layer and between the insulating layer and the semiconductor protective layer.

4. The flexible display device of claim 1, wherein the conductive via is connected to the source region or the drain region.

5. The flexible display device of claim 1, further comprising:
    a conductive pad located in the peripheral area and on the insulating layer, wherein the conductive via passes through the organic buffer layer and the insulating layer to connected to the conductive pad.

6. The flexible display device of claim 5, further comprising:
    an integrated circuit located in the peripheral area and on the insulating layer, and connected to the conductive pad.

7. The flexible display device of claim 5, further comprising:
    a flexible printed circuit board located in the peripheral area and on the insulating layer, and connected to the conductive pad.

8. The flexible display device of claim 1, wherein the first metal layer is located in the peripheral area and has a plurality of segments.

9. The flexible display device of claim 1, wherein a thickness of the first metal layer is in a range from 1500 Å to 4000 Å.

10. The flexible display device of claim 1, wherein the first metal layer has a first segment and a second segment, and the flexible display device further comprising:
    a protective layer located on the insulating layer, wherein each of a first conductive via, a second conductive via, and a third conductive via passes through the protective layer, the organic buffer layer, and the insulating layer;
    a first conductive pad, a second conductive pad, and a third conductive pad located in the peripheral area and on the protective layer, wherein two ends of the first conductive via are respectively connected to the first conductive pad and the first segment, two ends of the second conductive via are respectively connected to the second conductive pad and the second segment, and two ends of the third conductive via are respectively connected to the third conductive pad and the second segment;
    an integrated circuit connected to the first segment and the second segment through the first conductive pad, the second conductive pad, the first conductive via, and the second conductive via; and
    a flexible printed circuit board connected to the second segment through the third conductive pad and the third conductive via.

11. The flexible display device of claim 1, wherein the first metal layer extends to an edge of the flexible substrate, and is located between the organic buffer layer and the flexible substrate.

12. The flexible display device of claim 1, further comprising:
    an protective layer located on the insulating layer, wherein the protective layer, the insulating layer, and the organic buffer layer together have two through holes, and the first metal layer is partially located in the through holes.

13. The flexible display device of claim 12, further comprising:
    a second metal layer located on the first metal layer that is located in the through holes, and extending to sidewalls of the organic buffer layer surrounding the through holes, and extending between the organic buffer layer and the insulating layer.

14. The flexible display device of claim 13, wherein the second metal layer extends from the first metal layer that is located in one of the through holes to the first metal layer that is located in the other through hole.

15. The flexible display device of claim 13, further comprising:
    a first conductive layer located on the second metal layer that is located in the through holes, such that the second metal layer is located between the first conductive layer and the first metal layer.

16. The flexible display device of claim 15, wherein the first conductive layer extends to sidewalls of the insulating layer surrounding the through holes, and extends between the insulating layer and the protective layer.

17. The flexible display device of claim 15, wherein the first conductive layer extends from the second metal layer that is located in one of the through holes to the second metal layer that is located in the other through hole.

18. The flexible display device of claim 15, further comprising:
    a second conductive layer located on the first conductive layer that is located in the through holes, such that the first conductive layer is located between the second conductive layer and the second metal layer.

19. The flexible display device of claim 18, wherein the second conductive layer extends to sidewalls of the protective layer surrounding the through holes, and extends to a surface of the protective layer facing away from the insulating layer.

* * * * *